(12) United States Patent
Brondum

(10) Patent No.: US 7,442,285 B2
(45) Date of Patent: Oct. 28, 2008

(54) COMMON RACK FOR ELECTROPLATING AND PVD COATING OPERATIONS

(75) Inventor: Klaus Brondum, Longmont, CO (US)

(73) Assignee: Vapor Technologies, Inc., Longmont, CA (US)

( * ) Notice: Subject to any disclaimer, the term of this patent is extended or adjusted under 35 U.S.C. 154(b) by 890 days.

(21) Appl. No.: 10/869,965

(22) Filed: Jun. 17, 2004

(65) Prior Publication Data
US 2005/0279642 A1    Dec. 22, 2005

(51) Int. Cl.
*C23C 28/02* (2006.01)
*C25D 7/00* (2006.01)

(52) U.S. Cl. .................... 205/192; 205/145
(58) Field of Classification Search ........... 205/145, 205/192
See application file for complete search history.

(56) References Cited

U.S. PATENT DOCUMENTS

| | | | |
|---|---|---|---|
| 1,005,870 A | 10/1911 | Packer | |
| 2,793,994 A | 5/1957 | Novitsky | |
| 2,820,757 A | 1/1958 | Belke | |
| 2,898,285 A | 8/1959 | Henson | |
| 2,958,642 A | 11/1960 | Belke | |
| 3,042,605 A | 7/1962 | Belke | |
| 3,272,733 A | 9/1966 | Belke | |
| 3,357,913 A | 12/1967 | Zavarella | |
| 3,370,974 A * | 2/1968 | Hepfer | ............... 427/306 |
| 3,484,361 A | 12/1969 | Sperry | |
| 3,499,832 A | 3/1970 | Hearn, Jr. | |
| 3,533,828 A * | 10/1970 | Rowe | ............... 428/461 |
| 3,592,744 A * | 7/1971 | Grunwald et al. | ............... 205/159 |
| 3,619,243 A * | 11/1971 | Brindisi et al. | ............... 427/437 |
| 3,671,416 A | 6/1972 | Belke | |
| 3,728,232 A | 4/1973 | Morita et al. | |
| 3,939,056 A | 2/1976 | Fueki et al. | |
| 4,100,054 A | 7/1978 | DuRocher | |
| 4,176,039 A | 11/1979 | Wismer | |
| 4,872,963 A | 10/1989 | Van Horn | |
| 5,879,532 A | 3/1999 | Foster et al. | |
| 6,221,231 B1 | 4/2001 | Foster | |
| 6,391,457 B1 | 5/2002 | Welty et al. | |
| 6,399,219 B1 | 6/2002 | Welty et al. | |
| 6,527,925 B1 | 3/2003 | Batz, Jr. et al. | |
| 6,607,600 B2 | 8/2003 | DeWent | |

FOREIGN PATENT DOCUMENTS

| | | |
|---|---|---|
| EP | 0890659 A2 | 1/1999 |
| GB | 1512959 | 6/1978 |
| JP | 63161193 | 7/1988 |

OTHER PUBLICATIONS

PCT/US05/20939 Search Report & Opinion of Sep. 27, 2005.

* cited by examiner

*Primary Examiner*—Edna Wong
(74) *Attorney, Agent, or Firm*—Nirav D. Parikh; Lloyd D. Doigan

(57) ABSTRACT

Disclosed is a multi-step process for the coating of a substrate without re-racking the substrate between the coating operations comprising: providing a substrate holder with an inert protective polymeric coating covering a substantial portion of the holder; affixing a substrate to the substrate holder; electroplating a coating onto the substrate; without re-racking the substrate, applying a physical vapor deposition coating to the coated substrate; and removing the twice coated substrate from the substrate holder.

9 Claims, 1 Drawing Sheet

COMMON RACK FOR ELECTROPLATING AND PVD COATING OPERATIONS

FIELD OF THE INVENTION

The present invention presents to multi-step processing techniques for the application of coatings onto substrates where the substrate to be coated is placed onto a rack containing a plurality of substrate holders.

BACKGROUND OF THE INVENTION

Racks that are used for supporting substrates have been utilized for many years in the electroplating industry. The racks frequently are coated with a plastisol such as described in U.S. Pat. No. 4,176,039.

A variety of racks have been described in the art: U.S. Pat. Nos. 6,607,600; 6,527,925; 4,176,039; 4,100,054; 3,939,056; 3,728,232; 3,671,416; 3,499,832; 3,484,361; 3,357,913; 3,272,733; 3,042,605; 3,958,642; 2,898,285; 2,820,757; 2,973,994; 1,005,870; and British Patent 1,512,959.

A practical problem has arisen in utilization of racks for substrate holders that go through an electrodeposition technique namely that the coating that is applied during the electrodeposition technique remains on the substrate holder. Desirably, the same substrate holder would be utilized for subsequent processing. The difficulty with such approach as it pertains to physical vapor deposition techniques that the components of the material of a plastisol that is placed onto the substrate holder may volatilize from the substrate holder during the physical vapor deposition process. This may result in contaminated coated parts and other undesirable complications in the physical vapor deposition process such as control of the atmospheric conditions in the physical vapor deposition process itself.

BRIEF SUMMARY OF THE INVENTION

Described herewith is a multi-step process for the coating of a substrate without re-racking the substrate between coating operations comprising: providing a substrate holder with an inert protective nonconductive polymeric coating covering a substantial portion of the holder; affixing a substrate to the substrate holder; electroplating a coating onto the substrate; without re-racking the substrate, applying a physical vapor deposition coating to the coated substrate; and removing the coated substrate from the substrate holder.

Another embodiment in the multi-step process as described above wherein the substrate holder is comprised of an elongated rod having a first end with an aperture for receiving an electrode and the rod has a plurality of arms projecting outwardly from the center of the rod wherein the first end of the arm is affixed to the rod and the distal end of the arm is not coated with the protective coating and is adapted to hold the substrate during the coating operations.

Another embodiment is a rack for a multi-step process for the coating of a substrate comprising a metallic substrate holder with an inert protective polymeric coating covering a substantial portion of the holder; wherein the holder is an elongated rod having a first end with an aperture for receiving an electrode; the rod having a plurality of arms projecting outwardly from the center of the rod wherein the first end of the arm is affixed to the rod and the distal end of the arm is not coated with the protective coating and the distal end of the arm is adapted to hold a substrate during an electrodeposition process followed by a physical vapor deposition (PVD) process and wherein the inert coating is inert in the electrodeposition and the PVD processes.

DETAILED DESCRIPTION OF THE INVENTION

Figure 1:
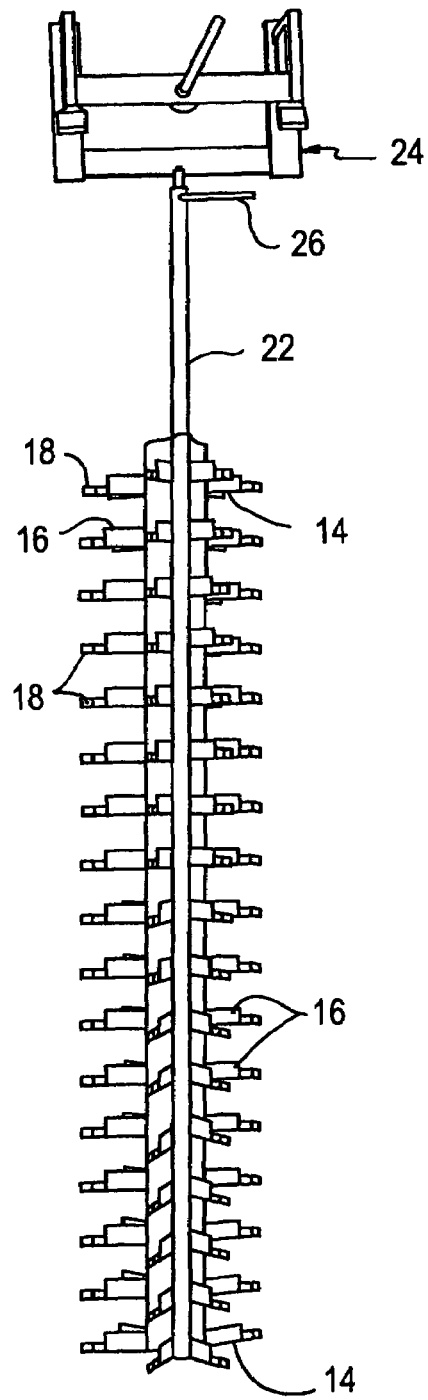
FIG. 1 is a view of a desired substrate holder utilized in the multi-step processes of the present invention attached to a rotating apparatus.

In the multi-step process of the present invention, it is desired that the substrate holder be comprised of an elongated rod with arms projecting therefrom. The arms would project from one end of the rod to the other such as from the top to the bottom to ensure that as many parts can be coated as is reasonably feasible for operation within the confines of the coating equipment.

The substrate holder first has a protective coating applied thereto which is inert in the subsequent electrodeposition process and physical vapor deposition (PVD) process steps. By "inert" is meant substantially chemical inactivity of the polymeric coating after it is applied to the substrate holder when the holder is passed through the electrodeposition and PVD processes. The protective coating desirably is an electrically insulating and durable coating which can resist the physical-chemical environment without substantially losing integrity. The protective coating can be applied by any well known technique to apply organic nonconductive coatings to the substrate holder. Such inert nonconductive coatings can be a variety of polymeric materials such as thermoplastic or thermoset materials that can be applied by spray, immersion, dipping or electrodeposition. Such materials are well known to those in the art and may include a polyolefin, such as polyethylene and polypropylene or a fluorinated polyethylene, such as Teflon (trademark of DuPont) an epoxy or an amide such as a nylon or a Kevlar (trademark of DuPont) material and the like.

Other inert polymeric materials that may be utilized as the coating over the substrate holder are commercially available polyacylates, polymethacylates, polystyrene and blends and co-polymers thereof.

One such powder coating is the epoxy material, Elasta, trademark of DuPont. Powder coatings are generally applied by the application of an electrostatic spray of the powder to a heated substrate. After the application of the powder, the substrate is then cooled and the powder covers substantially all of the substrate holder.

It is to be appreciated that for the substrate holders for subsequent processing in the present invention that the ends of the arms must be exposed as they will need a conductive surface to be attached to the substrate to be coated during the multi-step processing of the present invention. Therefore after the application of the inert protective coating, the ends of the arms have the coating removed. Alternatively, a mask is put onto the tips of the arms which is subsequently removed to expose the metallic portion underneath after the protective coating is applied to the substrate holder.

After the inert organic coating is applied, the desired substrate or workpiece to be coated is then attached to the substrate holder. The substrate holder with the substrates attached is subjected to an electrodeposition technique where the bath is an aqueous bath containing one or more metal ions that are to be deposited onto the substrate. Electrdeposition coatings and techniques are well known in the art. See for example *Metals Handbook, 9th Edition, volume 5*, entitled "Surface Cleaning, Finishing and Coating" copyright 1982, American Society for Metals, Inc. hereby incorporated by reference.

The substrate holder can be comprised of a variety of metallic substrates such as cold rolled steel, stainless steel, copper, brass and the like.

Figure 2:
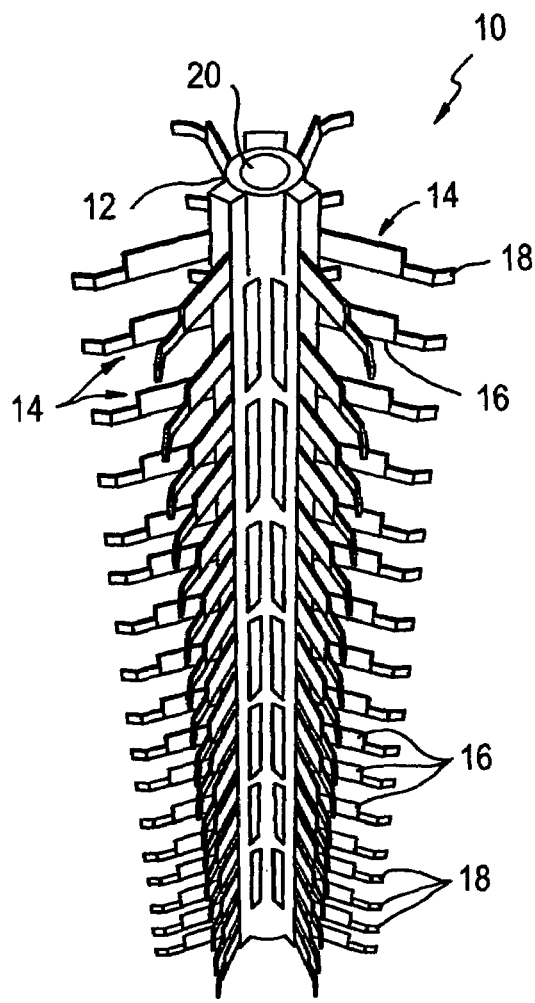
FIG. 2 is a perspective view of a desired substrate holder utilized in the multi-step processes of the present invention.

The substrate holder utilized in the present invention is shown in FIGS. 1 and 2. FIG. 2 is a perspective view of the holder 10. In general the holder can be considered as rod like 12 in shape with arms 14 projecting from the center of the arm. The arms extend from top to bottom of the rod. The inert coating 16 covers the entire portion of the substrate holder with the exception of the distal end of the arm 18. That portion has the metal un-coated to which the substrate to be coated is attached.

The substrate holder will have aperture 20 and holding rod 22 inserted therein during operation. The rod is attached to a conveying apparatus 24 and the rod is locked in place by locking member 26.

The substrate holder can be manufactured in any convenient fashion which would permit the maximum number of substrate holders on a given length of the rod. A convenient mechanism would be to stamp individual columns or leaf springs from the metallic substrate such as steel, stainless steel, copper and the like. The individual columns are then welded together at the middle of the individual segments to give the shape as shown in FIG. 2.

The rack is designed for ease of use in both electrodeposition and PVD processes. It is to be appreciated that in electrodeposition processes, the rack is adapted to the tank dimension. On the other hand, in PVD processes, a way to get even material distribution onto the subtrate of complex geometries is to expose the substrate surface to the source of coating material from different angles. This technique is utilized because PVD is a "line of sight" coating process.

The rack geometry was chosen so that the substrates to be coated appear as if they were "glued" to the outer wall of a cylinder. The rack can be rotated during the PVD process.

The metals that may be applied to the substrate or workpiece in the electrodeposition process include copper, chromium, nickel, zinc, cadmium, tin, lead, gold, brass, bronze, precious metals such as rhodium, platinum and the like. A preferred metal includes chromium and the like.

The substrate or workpiece to be coated can be comprised of a wide variety of materials, such as metals or plastic; such as a polyolefin or ABS. The substrate may likewise have another coating on it before the chrome is applied. The chrome may be deposited onto a nickel such as bright nickel or brass or a zinc die cast product.

It is to be appreciated that the substrate or workpiece may be treated in several electrodeposition processes, such as the application of nickel tungsten, nickel tin, nickel sulphamate, cobalt and the like.

Physical vapor deposition techniques are well known in the industry. Vapor deposition is known as producing a film or metal onto a surface, often in vacuum, either by decomposition of the vapor of a compound at the work surface or by direct reaction between the work surface and the vapor. Such vapor deposition techniques include chemical vapor deposition, cathodic arc evaporation or sputtering and the like. Sputtering techniques and equipment are disclosed in "Thin Film Processes II," Academic Press 1991 by J. Vossen and W. Kern, hereby incorporated by reference.

Chemical vapor deposition (CVD) is a well known and conventional process. CVD is generally classified into one of three types. The first two are principally predicated upon reactor pressure, and are designated as atmospheric pressure chemical vapor deposition (APCVD) or low pressure chemical vapor deposition (LPCVD). A third category is referred to as plasma enhanced chemical vapor deposition (PECVD).

Reactive sputtering may also be utilized as a PVD technique. Reactive sputtering is a process whereby the surface of an item is coated with a thin film formed through chemical reactions in the presence of a plasma charged particles in a vacuum chamber.

CVD processes are disclosed, inter alia, in U.S. Pat. Nos. 5,064,686; 4,803,127; 5,782,980; 5,824,365; 5,254,499 and 5,571,572, all of which are incorporated herein by reference.

When chromium is deposited by PVD it can also be chromium or an alloy thereof with nickel and/or iron or a chromium compound. The chromium compounds include the carbides, carbonitrides and nitrides, with the chromium nitrides being preferred. Other chromium compounds include, e.g., chromium oxide and chromium oxynitride. These compounds and their preparation are conventional and well known. The thickness of the chromium compound layer is a thickness at least effective to provide the coating with mechanical strength. Generally this thickness is from about 0.5 microns to about 10 microns, preferably from about 2 microns to about 5 microns.

Other patents which describe the physical vapor technique U.S. Pat. Nos. 5,922,478; 5,948,548; 6,132,889; 6,350,356; and 6,399,219, all hereby incorporated by reference.

Some commercially available physical vapor deposition equipment that may be used is VT 3000 or VT 1500 batch coders of Vapor Technologies Inc. of Boulder, Colo. It is to be appreciated that the rack containing the substrate holders with the workpieces attached can be oriented in a horizontal or vertical position during the PVD process.

As can be seen, the present invention has significant efficiencies by not having to re-rack the parts for the different processes. The coated substrate holder has the parts attached thereto. The loaded substrate holder then proceeds through the electrodeposition technique where the coated parts are dried and then are subjected to a physical vapor deposition.

While the form of the invention herein disclosed constitutes presently preferred embodiments, many others are possible. It is not intended herein to mention all of the possible equivalent forms or ramifications of the invention. It is understood that the terms used herein are merely descriptive rather than limiting and that the various changes may be made without departing from the spirit or scope of the invention. It is to be appreciated that the variety of substrates to be coated as well as the type of coating to be applied can vary substantially without departing from the scope of the invention.

I claim:

1. A multi-step process for applying coatings on a substrate without re-racking the substrate comprising:
   providing a substrate holder with an inert protective polymeric coating covering a substantial portion of the holder;
   racking the substrate on the substrate holder;
   electroplating a first coating onto the substrate;
   without re-racking the substrate, applying a physical vapor deposition second coating to the coated substrate; and
   removing the twice-coated substrate from the substrate holder.

2. The process of claim 1 wherein the protective coating is an epoxy or a polyolefin.

3. The process of claim 1 wherein said inert protective coating is an epoxy protective coating applied by a powder deposition technique.

4. The process of claim 1 wherein the substrate holder is an apparatus comprised of an elongated rod having a first end with an aperture for receiving an electrode; the rod having a plurality of arms projecting outwardly from the center of the rod wherein the first end of the arm is affixed to the rod and the distal end of the arm is not coated with the protective coating and is adapted to hold the substrate during said electroplating and deposition coating steps.

5. The process of claim 4 wherein the arms of the substrate holder are extended from the rod from one end of the rod to the other end.

6. The process of claim 1 wherein the electroplating step is the electroplating of a chromium first coating.

7. The process of claim 1 wherein the protective coating is an electrically insulating coating.

8. A multi-step process for applying coatings on a substrate without re-racking the substrate comprising:

provided a substrate holder with an inert epoxy protective nonconductive coating covering a substantial portion of the holder;

racking the substrate on the substrate holder;

electroplating a first coating onto the substrate;

without re-racking the substrate, applying a physical vapor deposition second coating to the coated substrate; and removing the twice-coated substrate from the substrate holder, wherein the substrate holder is an apparatus comprised of an elongated rod having a first end with an aperture for receiving an electrode; the rod having a plurality of arms projecting outwardly from the center of the rod wherein a first end of each arm is affixed to the rod and a distal end of the arm is not coated with the epoxy coating and is adapted to hold the substrate during the coating operations, wherein the arms are attached to the rod from one end of the rod to the other end.

9. The process of claim 8 wherein the electroplating step is electroplating of a chromium first coating onto the substrate.

* * * * *